(12) United States Patent
Lee et al.

(10) Patent No.: US 11,860,547 B2
(45) Date of Patent: *Jan. 2, 2024

(54) EXTRACTOR PIPING ON OUTERMOST SIDEWALL OF IMMERSION HOOD APPARATUS

(71) Applicant: Taiwan Semiconductor Manufacturing Company, Ltd., Hsinchu (TW)

(72) Inventors: Yung-Yao Lee, Zhubei (TW); Wei Chih Lin, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/076,754

(22) Filed: Dec. 7, 2022

(65) Prior Publication Data

US 2023/0097211 A1    Mar. 30, 2023

Related U.S. Application Data

(63) Continuation of application No. 17/349,231, filed on Jun. 16, 2021, now Pat. No. 11,543,754.

(51) Int. Cl.
*G03F 7/00* (2006.01)
*F28C 3/04* (2006.01)
*H01L 21/687* (2006.01)

(52) U.S. Cl.
CPC ............ *G03F 7/70341* (2013.01); *F28C 3/04* (2013.01); *H01L 21/68764* (2013.01)

(58) Field of Classification Search
CPC .... G03F 7/70341; G03F 7/70791; F28C 3/04; H01L 21/68764
See application file for complete search history.

(56) References Cited

U.S. PATENT DOCUMENTS 8,767,178 B2    7/2014   Lin et al.
9,329,492 B2    5/2016   Poon et al.
(Continued)

OTHER PUBLICATIONS

Shao et al. "Position Analysis of a Hybrid Serial-Parallel Manipulator in Immersion Lithography." Hindawi Publishing Corporation, Mathematical Problems in Engineering, vol. 2015, Article ID 573071, 14 pages, published on Apr. 5, 2015.
(Continued)

*Primary Examiner* — Hung V Nguyen
(74) *Attorney, Agent, or Firm* — Eschweiler & Potashnik, LLC

(57) ABSTRACT

In some embodiments, the present disclosure relates to a process tool that includes a lithography apparatus arranged over a wafer chuck and an immersion hood apparatus laterally around the lithography apparatus. The lithography apparatus includes a photomask arranged between a light source and a lens. The immersion hood apparatus comprises input piping, output piping, and extractor piping. The input piping is arranged on a lower surface of the immersion hood apparatus and configured to distribute a liquid between the lens and the wafer chuck. The output piping is arranged on the lower surface of the immersion hood apparatus and configured to contain the liquid arranged between the lens and the wafer chuck. The extractor piping is arranged on an outer sidewall of the immersion hood apparatus and configured to remove any liquid above the wafer chuck that is outside of the immersion hood apparatus.

20 Claims, 9 Drawing Sheets

(56) References Cited

U.S. PATENT DOCUMENTS

| | | | |
|---|---|---|---|
| 9,952,514 B2 | 4/2018 | Donders et al. | |
| 10,527,955 B2* | 1/2020 | Hoogendam | G03F 7/70808 |
| 11,543,754 B1* | 1/2023 | Lee | H01L 21/68764 |
| 2007/0103662 A1* | 5/2007 | Hazelton | G03F 7/70341 |
| | | | 355/53 |

OTHER PUBLICATIONS

Khan Academy. "What is Bernoulli's equation?" The date of publication is unknown. Retrieved online on Aug. 31, 2020 from https://www.khanacademy.org/science/physics/fluids/fluid-dynamics/a/what-is-bernoullis-equation.

Willson Rearch Group at The University of Texas at Austin. "Immersion Lithography." Published on Apr. 2, 2015.

Wikipedia.org "Immersion Lithography." Published on May 4, 2020.

Wikipedia.org "Photolithography." Published on Jul. 27, 2020.

Non-Final Office Action dated Feb. 17, 2022 for U.S. Appl. No. 17/349,231.

Final Office Action dated Jul. 11, 2022 for U.S. Appl. No. 17/349,231.

Notice of Allowance dated Sep. 21, 2022 for U.S. Appl. No. 17/349,231.

\* cited by examiner

EXTRACTOR PIPING ON OUTERMOST SIDEWALL OF IMMERSION HOOD APPARATUS

REFERENCE TO RELATED APPLICATION

This Application is a Continuation of U.S. application Ser. No. 17/349,231, filed on Jun. 16, 2021, the contents of which are hereby incorporated by reference in their entirety.

BACKGROUND

Integrated chips are fabricated in semiconductor fabrication facilities. Fabrication facilities contain processing tools that are configured to perform processing steps (e.g., etching steps, photolithography steps, deposition steps, etc.) upon a substrate. Lithography is a commonly used fabrication process by which a photomask having a pattern is irradiated with electromagnetic radiation through a series of lenses to transfer the pattern onto a photosensitive material overlying a substrate. Selective parts of the substrate may be subsequently processed according to the patterned photosensitive material.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
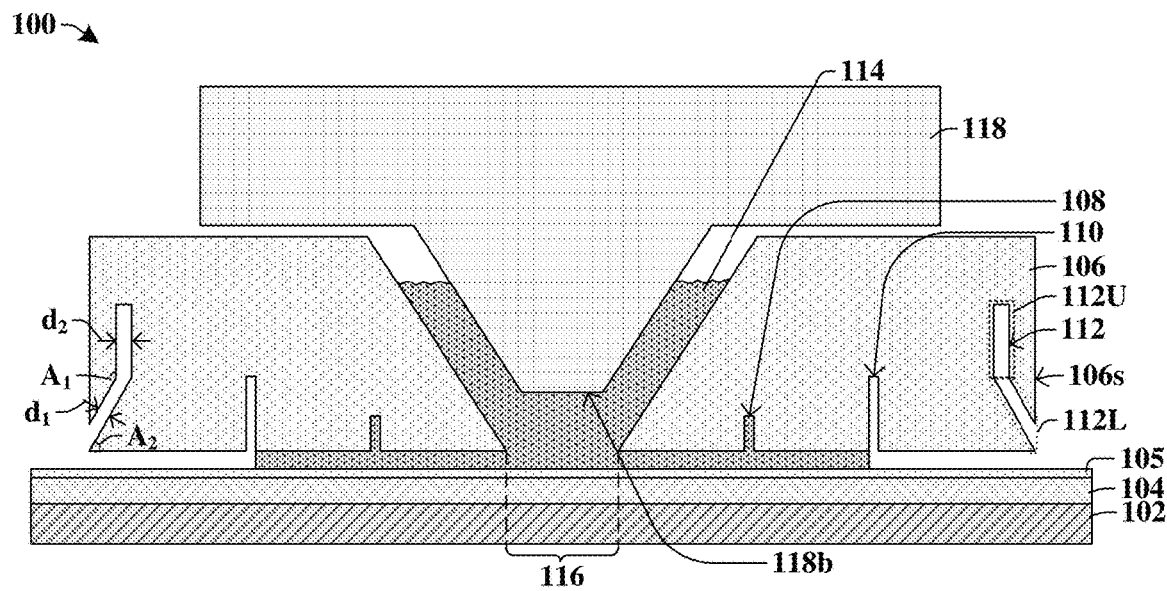
FIG. 1 illustrates a cross-sectional view of some embodiments of an immersion hood apparatus comprising extractor piping on outermost sidewalls of the immersion hood apparatus configured to remove residual water from a semiconductor substrate.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Instead of using air as in dry photolithography, immersion lithography uses a liquid between a bottommost lens and a photosensitive layer to increase the resolution of a solubility pattern transferred from a photomask to the photosensitive layer. The resolution of the solubility pattern transferred onto the photosensitive layer is related to the refractive index of the liquid used in the immersion lithography process. Oftentimes, the liquid used in immersion lithography has a refractive index greater than 1, such as water, for example. The photosensitive layer may be arranged over a semiconductor substrate, and various features are formed on or within the semiconductor substrate based on the solubility pattern transferred from the photomask to the photosensitive layer. Thus, the higher the resolution achieved by the immersion lithography process, the smaller the size of the features formed on or within the semiconductor substrate may be. By reducing the size of features and/or the space between features formed on or within a semiconductor substrate, the size of the overall device is reduced.

In immersion lithography, an immersion hood apparatus may comprise input piping used to inject water and output piping used to contain water on an immersion area of the semiconductor substrate. A lithography apparatus comprising a series of lenses, a photomask, and a light source may be arranged over the immersion hood apparatus and are configured to direct light onto the immersion area of the semiconductor substrate. The immersion hood apparatus and the lithography apparatus may stay stationary as the semiconductor substrate is moved around such that the pattern is transferred to the total desired area of the photosensitive layer on the semiconductor substrate.

However, in some embodiments, as the semiconductor substrate is moved around, residual liquid (e.g., water) may be left behind on the semiconductor substrate and does not get removed from the semiconductor substrate by the output piping of the immersion hood apparatus. The residual liquid (e.g., water) may damage features on the semiconductor substrate and/or negatively interfere with future processing steps.

Various embodiments of the present disclosure relate to an immersion hood apparatus comprising the input and output piping, as well as extractor piping on outermost sidewalls of the immersion hood apparatus. The extractor piping is configured to remove residual liquid left behind on areas of the semiconductor substrate. In some embodiments, the extractor piping is arranged at an angle favorable to remove the residual liquid up and away from the semiconductor substrate. By reducing or even eliminating residual liquid left behind by immersion lithography, the extractor piping on the outermost sidewalls of the immersion hood apparatus mitigates damage to and increases reliability of features on the semiconductor substrate.

FIG. 1 illustrates a cross-sectional view 100 of some embodiments of an immersion hood apparatus comprising extractor piping.

The cross-sectional view 100 of FIG. 1 illustrates an immersion hood apparatus 106 arranged over a wafer chuck 102. In some embodiments, the immersion hood apparatus 106 comprises an opening 116, and a lithography apparatus 118 is arranged over the immersion hood apparatus 106 and the opening 116. In some embodiments, the lithography apparatus 118 comprises one or more lenses, a light source, and a photomask between the light source and the one or more lenses. In some embodiments, the wafer chuck 102 is configured to hold a semiconductor substrate 104, which may be or comprise a semiconductor wafer. Further, in some embodiments, a photosensitive layer 105 is arranged over the semiconductor substrate 104.

In some embodiments, the immersion hood apparatus 106 comprises input piping 108 configured to inject a liquid 114 between a bottommost surface 118b of the lithography apparatus 118 and portions of the wafer chuck 102 and the photosensitive layer 105 arranged directly below the opening 116 of the immersion hood apparatus 106. In some embodiments, the liquid 114 naturally spreads outwards, away from the opening 116 and the input piping 108 of the immersion hood apparatus 106. Thus, in some embodiments, the immersion hood apparatus 106 further comprises output piping 110 configured to remove the liquid 114 that travels away from the opening 116 and the input piping 108 of the immersion hood apparatus 106. In other words, the output piping 110 is configured to contain the liquid 114 to an immersion area over the wafer chuck 102 defined by a perimeter of the output piping 110. In some embodiments, the input piping 108 and the output piping 110 are arranged on a lower surface of the immersion hood apparatus 106.

During operation, an immersion lithography process is performed, wherein light from the light source in the lithography apparatus 118 is directed through the photomask and the one or more lenses to change a solubility of portions of the photosensitive layer 105 according to the photomask. Because of the liquid 114 arranged between the lithography apparatus 118 and the photosensitive layer 105, the light also travels through the liquid 114. In some embodiments, the liquid 114 has a refractive index greater than 1. In some embodiments, the liquid 114, may comprise, for example, water. The liquid 114 increases the resolution of the light that reaches the photosensitive layer 105 according to the photomask, thereby reducing the sizes of features formed on the photosensitive layer 105 and/or the semiconductor substrate 104 based on the immersion lithography process. In some embodiments, the wafer chuck 102 is configured to move and to hold onto the semiconductor substrate 104 while moving such that the immersion lithography process may be conducted on the entire area of the photosensitive layer 105. Then, in some embodiments, the photosensitive layer 105 may be developed, or exposed to a wet etchant, to remove soluble portions of the photosensitive layer 105 as defined by the photomask and immersion lithography process.

In some embodiments, the immersion hood apparatus 106 further comprises extractor piping 112 arranged on outermost sidewalls 106s of the immersion hood apparatus 106. The extractor piping 112 is configured to remove residual liquid that escapes from between the immersion hood apparatus 106 and the wafer chuck 102 as the wafer chuck 102 moves during the immersion lithography process. In some embodiments, the extractor piping 112 comprises a lower segment 112L that extends from the outermost sidewalls 106s and towards the opening 116 of the immersion hood apparatus and comprises an upper segment 112U that extends from the lower segment 112L and vertically away from the wafer chuck 102. The lower segment 112L of the extractor piping 112 is continuously connected to the upper segment 112U of the extractor piping 112.

In some embodiments, the lower segment 112L meets the upper segment 112U at a first angle $A_1$ measured on a side of the extractor piping 112 that is closest to the outermost sidewalls 106s of the immersion hood apparatus 106. In some embodiments, the first angle $A_1$ is an obtuse angle, and thus, is greater than 90 degrees. In some embodiments, the lower segment 112L of the extractor piping 112 is arranged at a second angle $A_2$ with respect to the lower surface of the immersion hood apparatus 106. In some embodiments, the second angle $A_2$ is an acute angle, and thus, is less than 90 degrees. In such embodiments, the somewhat horizontal and somewhat vertical lower segment 112L of the extractor piping 112 increases the effectiveness of the extractor piping 112 of removing residual liquid up and away from the photosensitive layer 105. In some embodiments, the upper segment 112U is arranged at a substantially right angle with respect to the lower surface of the immersion hood apparatus 106.

Further, in some embodiments, the lower segment 112L of the extractor piping 112 has a first diameter $d_1$, and the upper segment 112U of the extractor piping 112 has a second diameter $d_2$. In some embodiments, the first and second diameter $d_1$, $d_2$ are each in a range of between, for example, approximately 0.05 millimeters and approximately 100 millimeters. In some embodiments, if the first or second diameters $d_1$, $d_2$ are less than 0.05 millimeters, the extractor piping 112 may be too small to remove the liquid 114. In some embodiments, the second diameter $d_2$ is greater than or equal to the first diameter $d_1$. Accordingly, in some embodiments, pressure or exhaust velocity in the lower segment 112L of the extractor piping 112 is equal to or greater than pressure or exhaust velocity in the upper segment 112U of the extractor piping 112. This way, residual liquid that is not arranged directly between the immersion hood apparatus 106 and the wafer chuck 102 may be effectively removed by the extractor piping 112 to reduce defects cause by residual liquid over the photosensitive layer 105 as the immersion lithography process is conducted.

Figure 2:
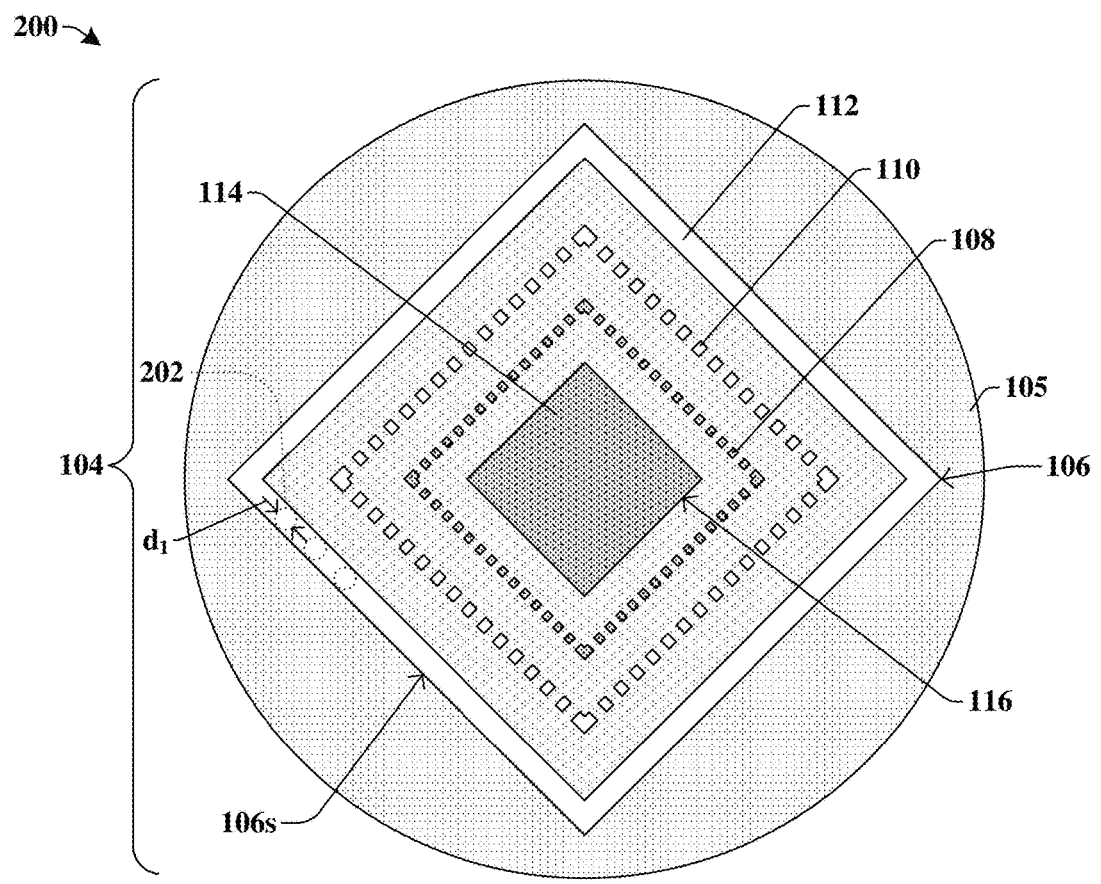
FIG. 2 illustrates a top-view of some embodiments of an immersion hood apparatus comprising extractor piping arranged on outermost sidewalls of the immersion hood apparatus configured to remove residual water from a semiconductor substrate.

FIG. 2 illustrates a top-view 200 of some embodiment of an immersion hood apparatus arranged over a semiconductor substrate.

In some embodiments, the immersion hood apparatus 106 has an overall square-like shape from the top-view 200. In some other embodiments, the immersion hood apparatus 106 may have an overall rectangular-like shape, circular-like shape, or some other shape from the top-view 200. In some embodiments, the input piping 108 and the output piping 110 of the immersion hood apparatus 106 may each comprise multiple pipes having openings spaced apart from one another. In some embodiments, the extractor piping 112 may comprise a continuous opening around the perimeter of the immersion hood apparatus 106. In some other embodiments, the extractor piping 112 may comprise multiple pipes having openings 202 spaced apart from one another. In some embodiments, the openings 202 are actually arranged on the outermost sidewall 106s of the immersion hood apparatus 106, and thus, are illustrated with dotted lines in the top-view 200 of FIG. 2. In some embodiments, the openings 202 of each pipe of the extractor piping 112 may have the first diameter $d_1$.

Further, in some embodiments, an inner perimeter of the immersion hood apparatus 106 may be defined by the opening 116 in the immersion hood apparatus 106. In some embodiments, the opening 116 may have an overall square-like shape from the top-view 200, whereas in other embodiments, the opening 116 may have an overall rectangular-like shape, circular-like shape, or some other shape from the top-view 200.

In some embodiments, during parts of the immersion lithography process, the immersion hood apparatus 106 may completely and directly overlie the semiconductor substrate 104, whereas during other parts of the immersion lithography process, the immersion hood apparatus 106 may only partially and directly overlie the semiconductor substrate 104. Thus, in some embodiments and/or during some times of the immersion lithography process, the extractor piping 112 completely overlies the semiconductor substrate 104, whereas in other embodiments and/or during other times of the immersion lithography process, only some of the extractor piping 112 directly overlies the semiconductor substrate 104. Nevertheless, in some embodiments, the extractor piping 112 is arranged at the outer perimeter of the immersion hood apparatus 106 on the outermost sidewalls 106s of the immersion hood apparatus 106 to remove any residual liquid arranged on portions of the photosensitive layer 105 that are not arranged directly between the immersion hood apparatus 106 and the semiconductor substrate 104 or that are not arranged directly between the opening 116 of the immersion hood apparatus 106 and the semiconductor substrate 104.

Figure 3:
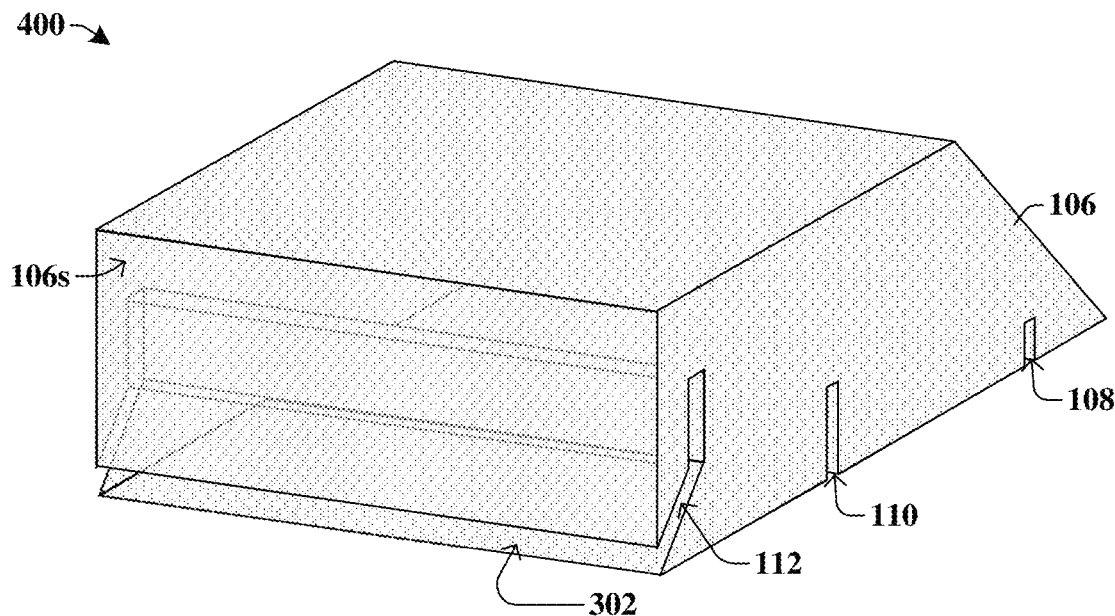
FIGS. 3 and 4 illustrate perspective views of some embodiments of an outermost sidewall of an immersion hood apparatus that comprises extractor piping.

FIG. 3 illustrates a perspective view 300 of some embodiments of an outer sidewall of a portion of an immersion hood apparatus comprising extractor piping.

In some embodiments, as in the perspective view 300 of FIG. 3, the extractor piping 112 comprises a continuous pipe and opening 302 on the outermost sidewalls 106s of the immersion hood apparatus 106.

Figure 4:
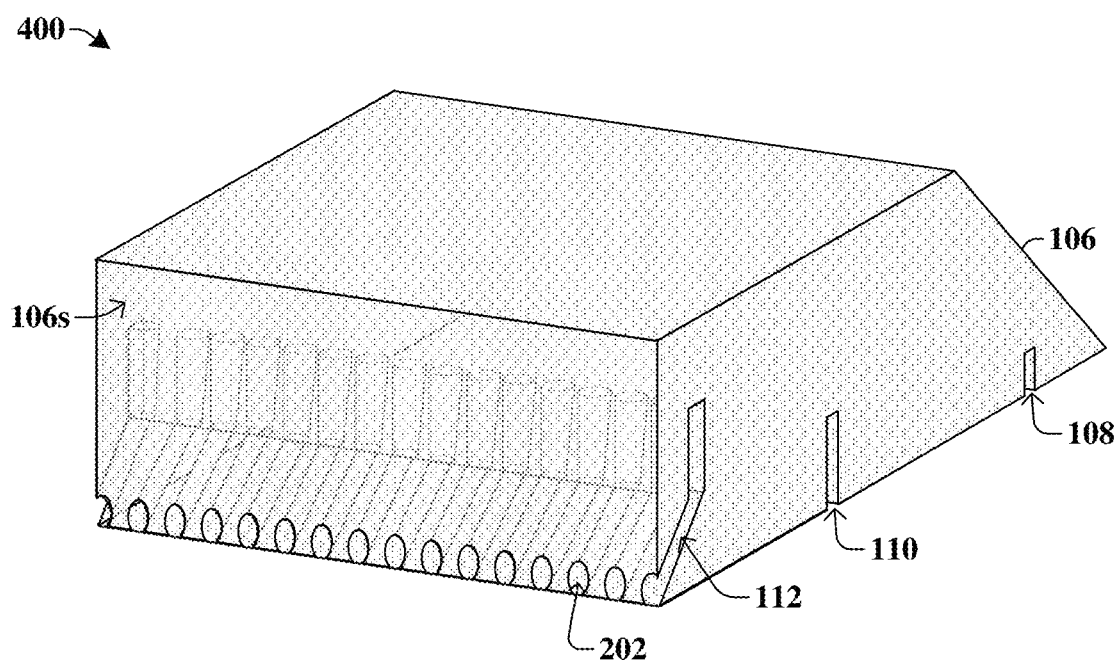

FIG. 4 illustrates a perspective view 400 of some other embodiments of an outer sidewall of a portion of an immersion hood apparatus comprising extractor piping.

In some embodiments, as in the perspective view 400 of FIG. 4, the extractor piping 112 comprises multiple pipes with openings 202 on the outermost sidewalls 106s of the immersion hood apparatus 106. In such embodiments, the exhaust force or the exhaust velocity of each pipe of the extractor piping 112 is greater than the exhaust force or the exhaust velocity of the continuous pipe and opening (302 of FIG. 3) as illustrated in the embodiment of FIG. 3. Thus, in some embodiments, the extractor piping 112 comprising multiple pipes with openings 202 as illustrated in FIG. 4 has a higher exhaust velocity and thus, is more effective in removing residual water from the photosensitive layer (105 of FIG. 1) during the immersion lithography process than extractor piping 112 that comprises a continuous pipe as illustrated in FIG. 3.

Figure 5:
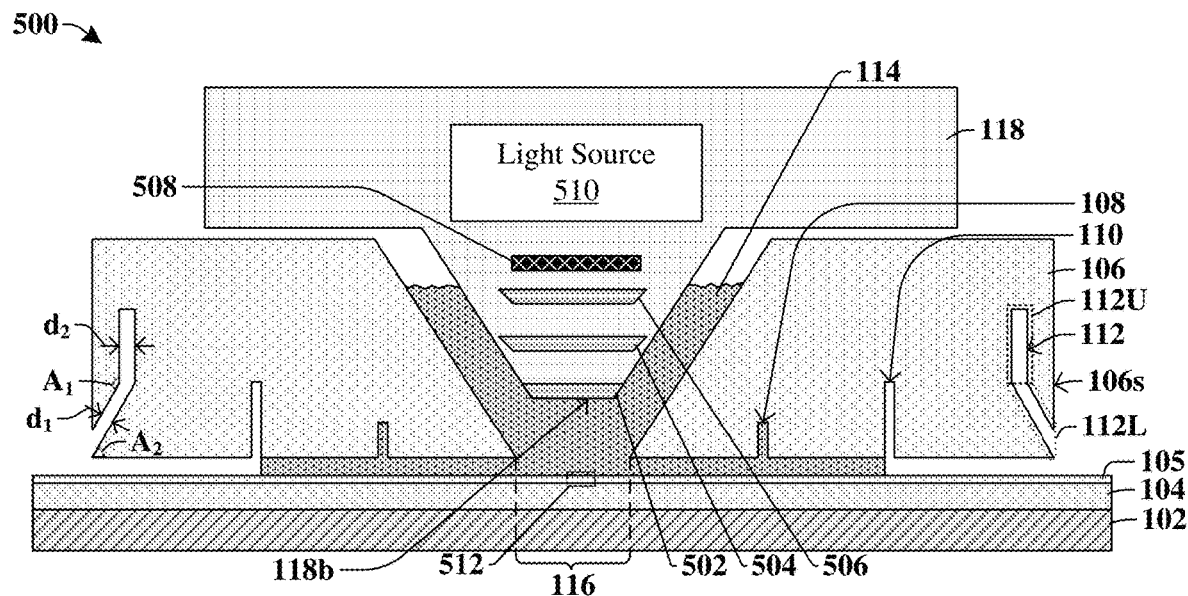
FIG. 5 illustrates a cross-sectional view of some embodiments of a lithography apparatus comprising a lens, light source, and photomask that is surrounded by an immersion hood apparatus comprising extractor piping on outermost sidewalls of the immersion hood apparatus.

FIG. 5 illustrates a cross-sectional view 500 of some embodiments of an immersion hood apparatus and a lithography apparatus configured to pattern a first area of an underlying photosensitive layer.

In some embodiments, the lithography apparatus 118 comprises a light source 510 configured to apply light/electromagnetic radiation towards the photosensitive layer 105 beneath the opening 116 in the immersion hood apparatus 106. In some embodiments, the light source 510 is configured to apply light having a wavelength in a range of between, for example, approximately 175 nanometers and approximately 200 nanometers. In some embodiments, the lithography apparatus 118 further comprises a photomask 508 arranged below the light source 510. The photomask 508 may comprise a solubility pattern having portions that allow light to pass through and other portions that do not allow light to pass through. The light that passes through the photomask 508 changes the solubility of the photosensitive layer 105. Further, in some embodiments, a series of lenses, such as, a first lens 502, a second lens 504 arranged over the first lens 502, and a third lens 506 arranged over the second lens 504, are arranged between the bottommost surface 118b of the lithography apparatus 118 and the photomask 508. In some embodiments, the first, second, and third lenses 502, 504, 506 focus the light from the light source 510 that travels through the photomask 508 towards a first area 512 on the photosensitive layer 105. In some embodiments, the first, second, and third lenses 502, 504, 506 are used because the photomask 508 is larger than the desired solubility pattern to be transferred onto the first area 512 of the photosensitive layer 105. Thus, between the first lens 502, the second lens 504, the third lens 506, and/or the liquid 114, the solubility pattern defined by the photomask 508 is reduced in size and transferred onto the first area 512 of the photosensitive layer 105 with a high resolution.

In some embodiments, the liquid 114 is arranged between the bottommost lens (i.e., the first lens 502) and the first area 512 of the photosensitive layer 105. In some embodiments, when light travels through the liquid 114 instead of, for example, air, the resolution of the light and thus, the solubility pattern transferred from the photomask 508 to the first area 512 of the photosensitive layer 105 is increased.

FIGS. 6-15 illustrate various views 600-1500 of some embodiments of a method of conducting an immersion lithography process, wherein extractor piping on outermost sidewalls of an immersion hood apparatus removes residual water as the immersion lithography process is conducted on different areas over a semiconductor substrate. Although FIGS. 6-15 are described in relation to a method, it will be appreciated that the structures disclosed in FIGS. 6-15 are not limited to such a method, but instead may stand alone as structures independent of the method.

Figure 6:
FIGS. 6-15 illustrate cross-sectional views of some embodiments of a method of performing immersion lithography using an immersion hood apparatus, wherein the immersion hood apparatus comprises extractor piping on outermost sidewalls of the immersion hood apparatus configured to remove residual water from a semiconductor substrate.

As shown in cross-sectional view 600 of FIG. 6, a semiconductor substrate 104 is provided. In some embodiments, the semiconductor substrate 104 may comprise any type of semiconductor body (e.g., silicon/CMOS bulk, SiGe, SOI, etc.) such as a semiconductor wafer or one or more die on a wafer, as well as any other type of semiconductor and/or epitaxial layers formed thereon and/or otherwise associated therewith. In some embodiments, a photosensitive layer 105 is formed on the semiconductor substrate 104. In some embodiments, the photosensitive layer 105 comprises a material that may change in solubility when exposed to light having a certain wavelength or within a certain range of wavelengths. In some embodiments, the photosensitive layer 105 may be formed by way of, for example, a spin-on process or some other deposition process (e.g., physical vapor deposition (PVD), chemical vapor deposition (CVD), atomic layer deposition (ALD), etc.). Further, in some embodiments, other layers and/or features may be arranged between the photosensitive layer 105 and the semiconductor substrate 104, such as, for example, dielectric layers, conductive features (e.g., wires, vias), transistors, or the like.

Figure 7:
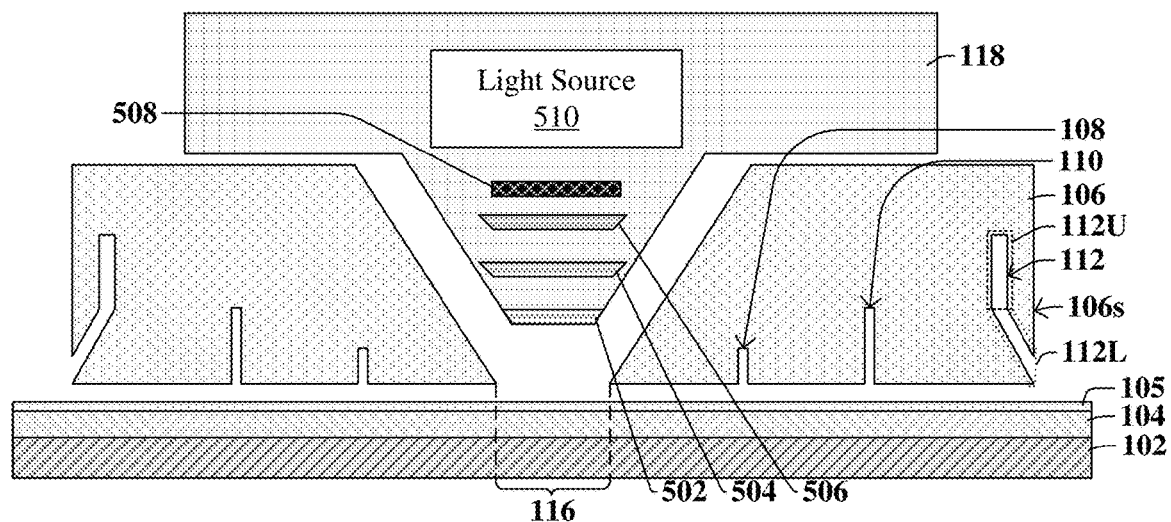

As shown in cross-sectional view 700 of FIG. 7, the semiconductor substrate 104 is transported onto a wafer chuck 102 and is arranged below an immersion hood apparatus 106 and a lithography apparatus 118. In some embodiments, the lithography apparatus 118 is laterally surrounded by the immersion hood apparatus 206 and is arranged directly over an opening 116 of the immersion hood apparatus 106. In some embodiments, the lithography apparatus 118 comprises a light source 510, a photomask 508, and a first lens 502 arranged directly over the opening 116 of the immersion hood apparatus 106. In some embodiments, the lithography apparatus 118 comprises more than one lens, such as, for example, a second lens 504 and a third lens 506 in addition to the first lens 502. In some embodiments, the immersion hood apparatus 106 comprises input piping 108 and output piping 110 arranged on a lower surface of the immersion hood apparatus 106 and comprises extractor piping 112 arranged on outermost sidewalls 106s of the immersion hood apparatus 106.

Figure 8:
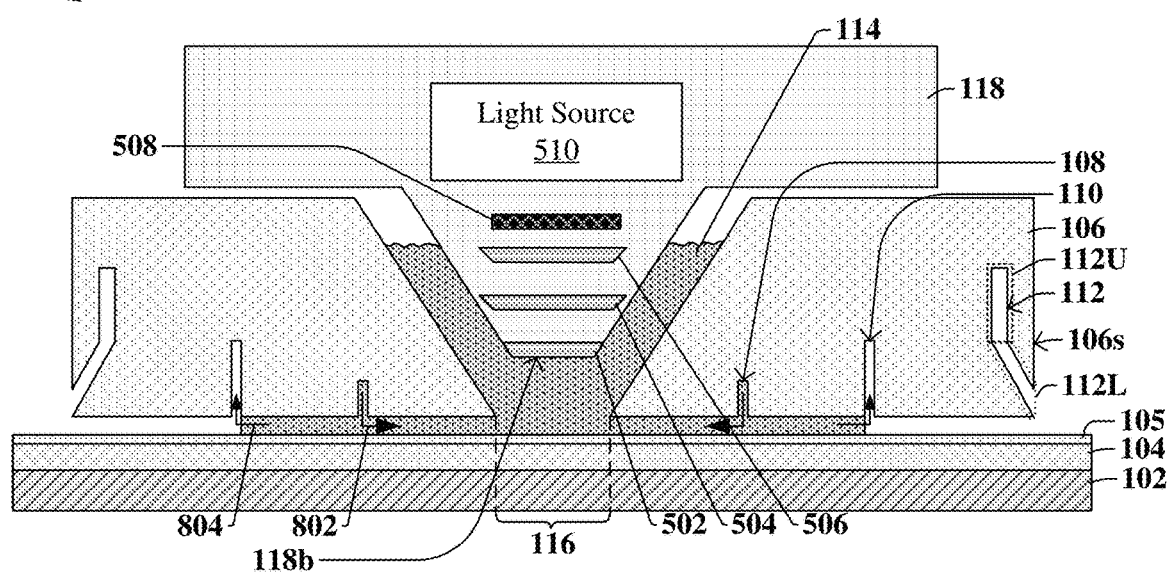

As shown in cross-sectional view 800 of FIG. 8, in some embodiments, the immersion hood apparatus 106 is turned "ON" such that a liquid 114 is injected 802 onto an immersion area of the photosensitive layer 105 via the input piping 108 of the immersion hood apparatus 106. In some embodiments, the liquid 114 has a refractive index greater than 1. In some embodiments, the liquid 114 comprises, for example, water. In some embodiments, the input piping 108 injects 802 the liquid 114 at a rate of between, for example, approximately 1000 milliliters per minute to approximately 1350 milliliters per minute. In some embodiments, the liquid 114 completely fills a space directly between the photosensitive layer 105 and a bottommost surface 118b of the lithography apparatus 118 and/or directly between a lowermost lens (i.e., the first lens 502) and the photosensitive layer 105.

Meanwhile, in some embodiments, as the input piping 108 injects 802 the liquid over the photosensitive layer 105, the output piping 110 removes 804 any of the liquid 114 that moves away from the input piping 108 towards an edge of the semiconductor substrate 104. In such embodiments, the output piping 110 may confine the liquid to the immersion area on the photosensitive layer 105, as defined by a perimeter of the output piping 110. In some embodiments, the output piping 110 removes 804 the liquid 114 at a rate between, for example, approximately 50 milliliters per minute and approximately 100 milliliters per minute. Further, in some embodiments, the input piping 108 and the output piping 110 each have a diameter in a range of between, for example, approximately 0.05 millimeters and approximately 100 millimeters.

Figure 9:
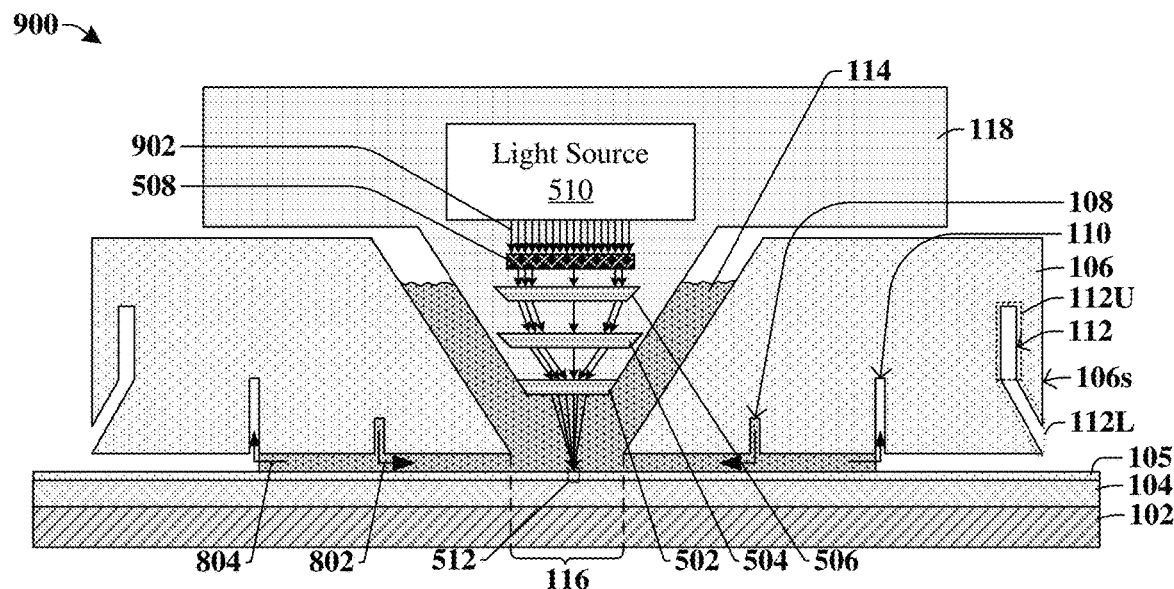

As shown in cross-sectional view 900 of FIG. 9, in some embodiments, after the liquid 114 is arranged between the first lens 502 and the photosensitive layer 105 and while the input piping 108 and the output piping 110 are continuously injecting 802 and removing 804, respectively, the liquid 114, the light source 510 is turned "ON." In some embodiments, when the light source 510 is turned "ON," light 902 is directed towards the photomask 508. In some embodiments, the light 902 has a wavelength in a range of between, for example, approximately 175 nanometers and approximately 200 nanometers. It will be appreciated that other wavelengths are also within the scope of this disclosure. In some embodiments, only some of the light 902 emitted from the light source 510 is able to pass through the photomask 508 based on the solubility pattern of the photomask 508. Then, in some embodiments, the light 902 travels through the first, second, and/or third lenses 502, 504, 506 and also travels through the liquid 114 to transfer the solubility pattern of the photomask 508 to a first area 512 on the photosensitive layer 105. Because the light 902 travels through the liquid 114, the solubility pattern is transferred onto the photosensitive layer 105 at a higher resolution than if the light 902 traveled through air before reaching the first area 512.

Figure 10:
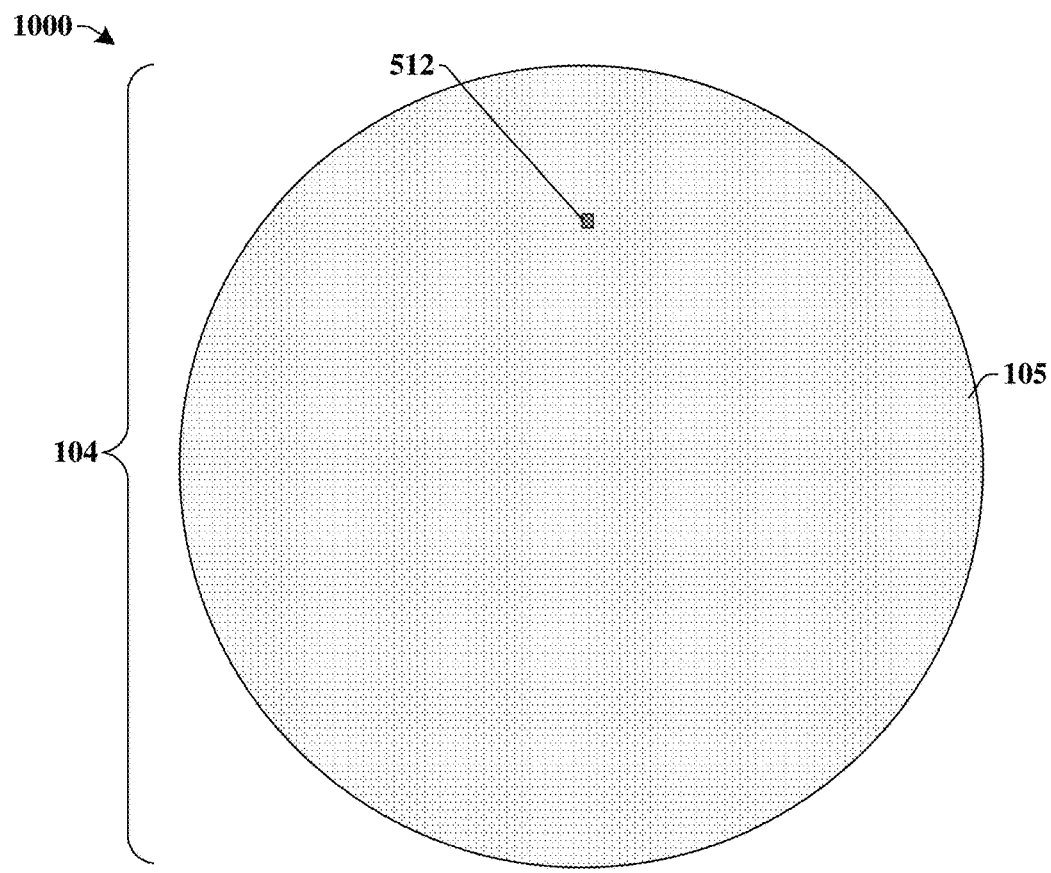

FIG. 10 illustrates a top-view 1000 of some embodiments of the semiconductor substrate 104 after the first area 512 is exposed to the light (902 of FIG. 9) according to the photomask (508 of FIG. 9).

As shown in the top-view 1000 of FIG. 10, in some embodiments, the first area 512 is only a small portion of the total area of the photosensitive layer 105. In some such embodiments, the steps of the immersion lithography process illustrated in FIGS. 8 and/or 9 may be repeated many times to transfer the solubility pattern of the photomask (508 of FIG. 9) to the total area of the photosensitive layer 105.

Figure 11A:
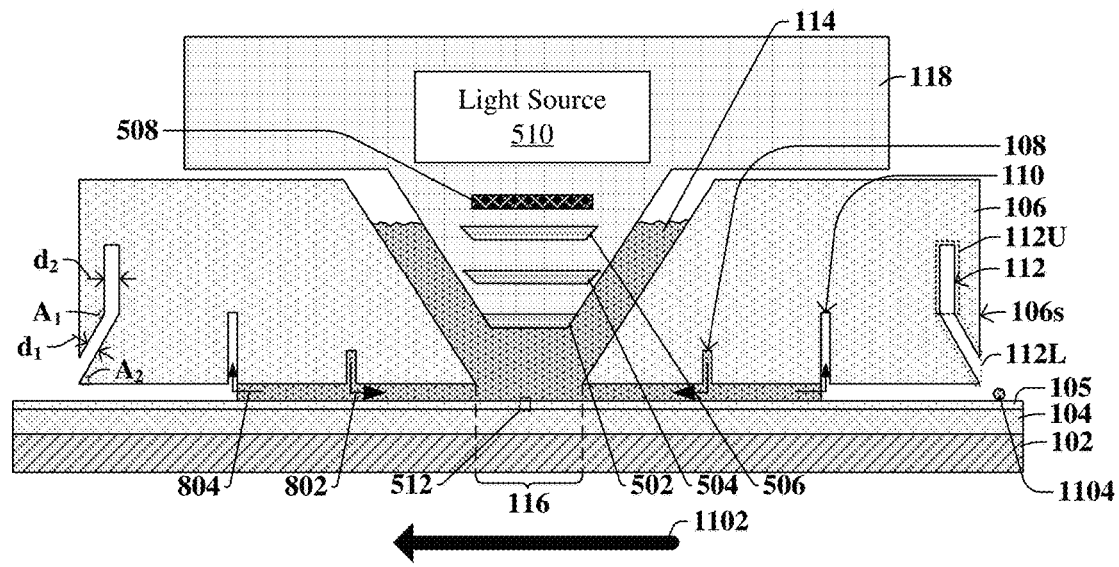

As shown in cross-sectional view 1100A of FIG. 11A, in some embodiments, the wafer chuck 102 is moved 1102 such that a new area of the photosensitive layer 105 may be exposed to the solubility pattern of the photomask 508 by the immersion lithography process. In some embodiments, the wafer chuck 102 is configured to securely hold onto the semiconductor substrate 104 and thus, the photosensitive layer 105 as the wafer chuck 102 is moved 1102. In some embodiments, the immersion hood apparatus 106 and the lithography apparatus 118 remain stationary while the wafer chuck 102 moves.

As the wafer chuck 102 moves 1102, the input and output piping 108, 110 continue to inject 802 and remove 804, respectively, the liquid 114 to confine the liquid 114 within the immersion area defined by the perimeter of the output piping 110. However, in some embodiments, some of the liquid 114 inevitably escapes from the immersion area, and thus, residual liquid 1104 escape to a portion of the photosensitive layer 105 that is not directly between the immersion hood apparatus 106 and the wafer chuck 102. In such embodiments, the residual liquid 1104 could damage the photosensitive layer 105 and/or future processing steps on the semiconductor substrate 104.

Thus, in some embodiments, the extractor piping 112 is arranged on the outermost sidewalls 106s of the immersion hood apparatus 106 to remove residual liquid 1104 arranged outside of the immersion hood apparatus 106 outer perimeter. In some embodiments, the extractor piping 112 comprises a lower segment 112L and an upper segment 112U that meet at a first angle $A_1$ that is greater than 90 degrees. Further, in some embodiments, the lower segment 112L is arranged at a second angle $A_2$ with respect to a lower surface of the immersion hood apparatus 106. In some embodiments, the second angle $A_2$ is between 0 and 90 degrees. In some embodiments, the lower segment 112L of the extractor piping 112 has a first diameter $d_1$, and the upper segment 112U of the extractor piping 112 has a second diameter $d_2$. In some embodiments, the second diameter $d_2$ is greater than or equal to the first diameter $d_1$. In some embodiments, the first and second angles $A_1$, $A_2$ as well as the relationship between the first and second diameters $d_1$, $d_2$ help increase the exhaust velocity of the extractor piping 112 to increase the rate and effectiveness of removal of the residual liquid 1104.

Figure 11B:
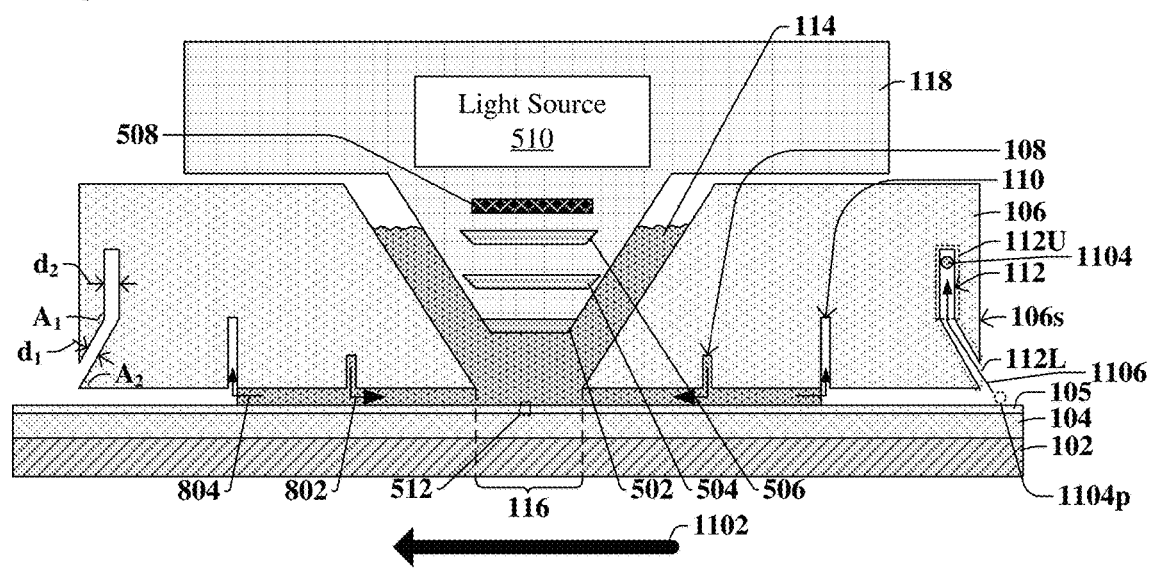

As shown in cross-sectional view 1100B of FIG. 11B, as or after the wafer chuck 102 is moving 1102, the extractor piping 112 may remove 1106 the residual liquid 1104 from the photosensitive layer 105. Thus, in some embodiments, the cross-sectional view 1100A of FIG. 11A illustrates a first time period, and the cross-sectional view 1100B of FIG. 11B illustrates a second time period after the first time period. The previous location 1104p of the residual liquid 1104 is illustrated in FIG. 11B with dotted lines for convenience. In some embodiments, the extractor piping 112 is continuously running or is always "ON" while the input and output piping 108, 110 are "ON" such that the extractor piping 112 may remove any residual liquid 1104 outside of immersion hood apparatus 106 at any time during the immersion lithography process. In other embodiments, the extractor piping 112 may be turned "ON" only while the wafer chuck 102 moves 1102.

When the extractor piping 112 is continuously "ON," even if, in some embodiments, residual liquid 1104 is left behind on the photosensitive layer 105 during various steps of the immersion lithography process, the extractor piping 112 is arranged on outermost sidewalls 106s of the immersion hood apparatus 106 to remove the residual liquid 1104, thereby mitigating damage to the photosensitive layer 105 and/or overall devices formed on or within the semiconductor substrate 104.

Figure 12:
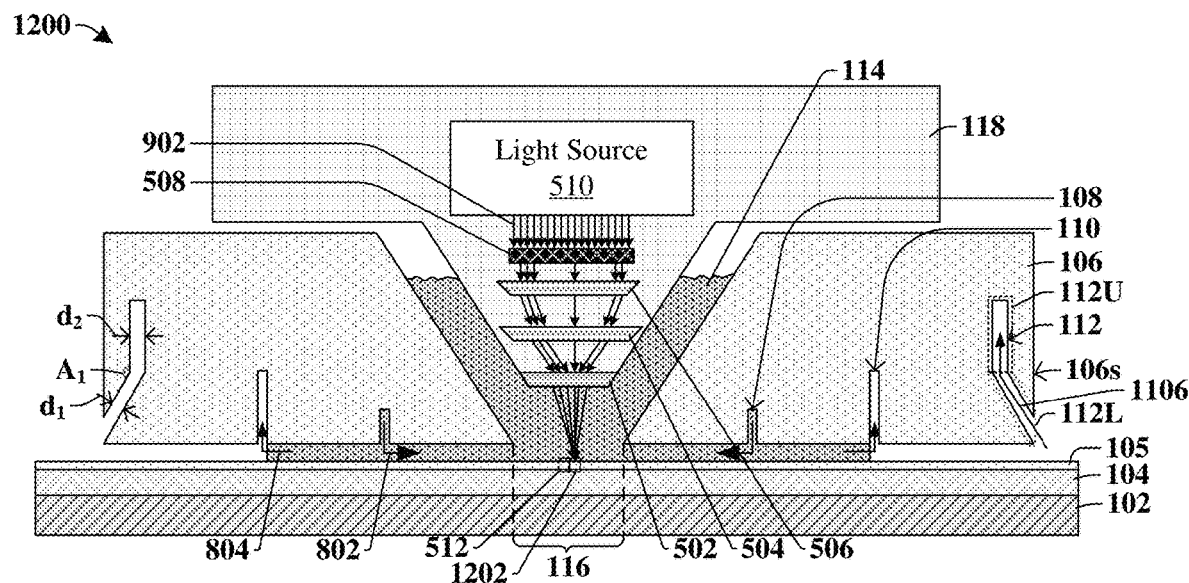

As shown in cross-sectional view 1200 of FIG. 12, in some embodiments, after moving (1102 of FIG. 11B) the wafer chuck 102, the light source 510 is again turned "ON" to transfer the solubility pattern from the photomask 508 to a second area 1202 on the photosensitive layer 105.

Figure 13:
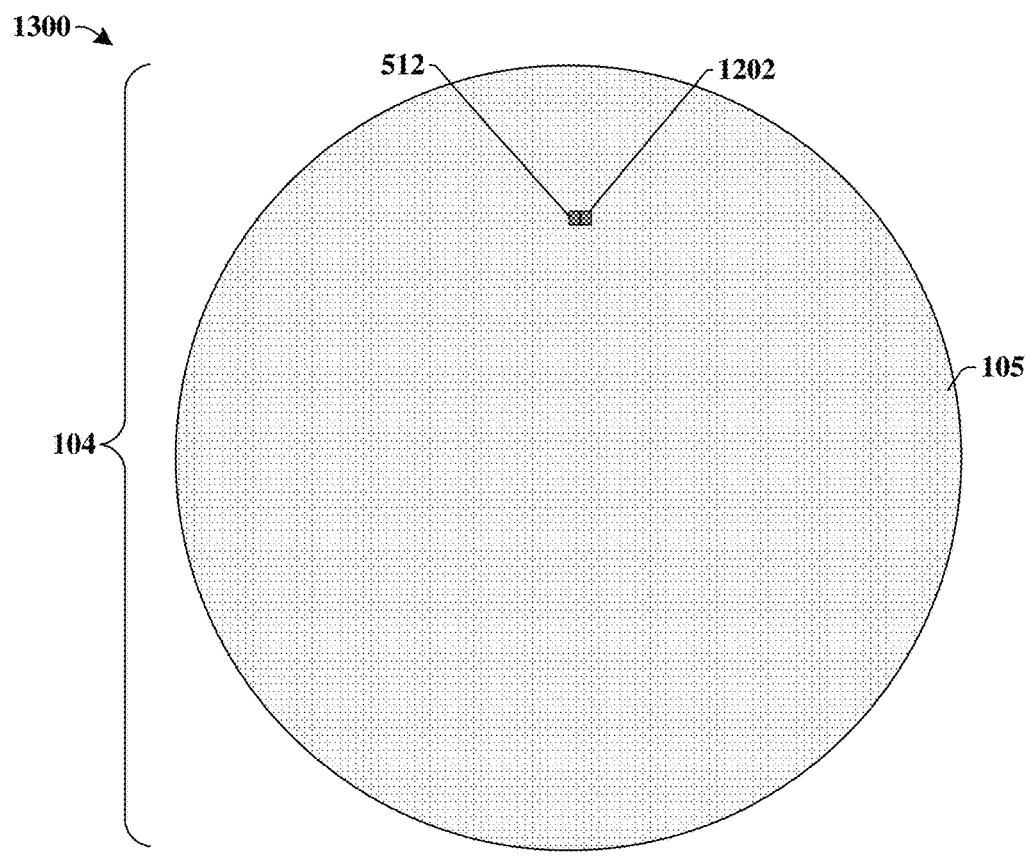

FIG. 13 illustrates a top-view 1300 of some embodiments of the semiconductor substrate 104 after the second area 1202 is exposed to the light (902 of FIG. 12) according to the photomask (508 of FIG. 12). In some embodiments, the second area 1202 may be arranged next to, but not overlapping, with the first area 512. It will be appreciated that the size and shape of the first and second areas 512, 1202 from the top-view 1300 are an example, and that in other embodiments, the size and shape of the first and second areas 512, 1202 may be different than what is illustrated in the top-view 1300 of FIG. 13.

Figure 14:
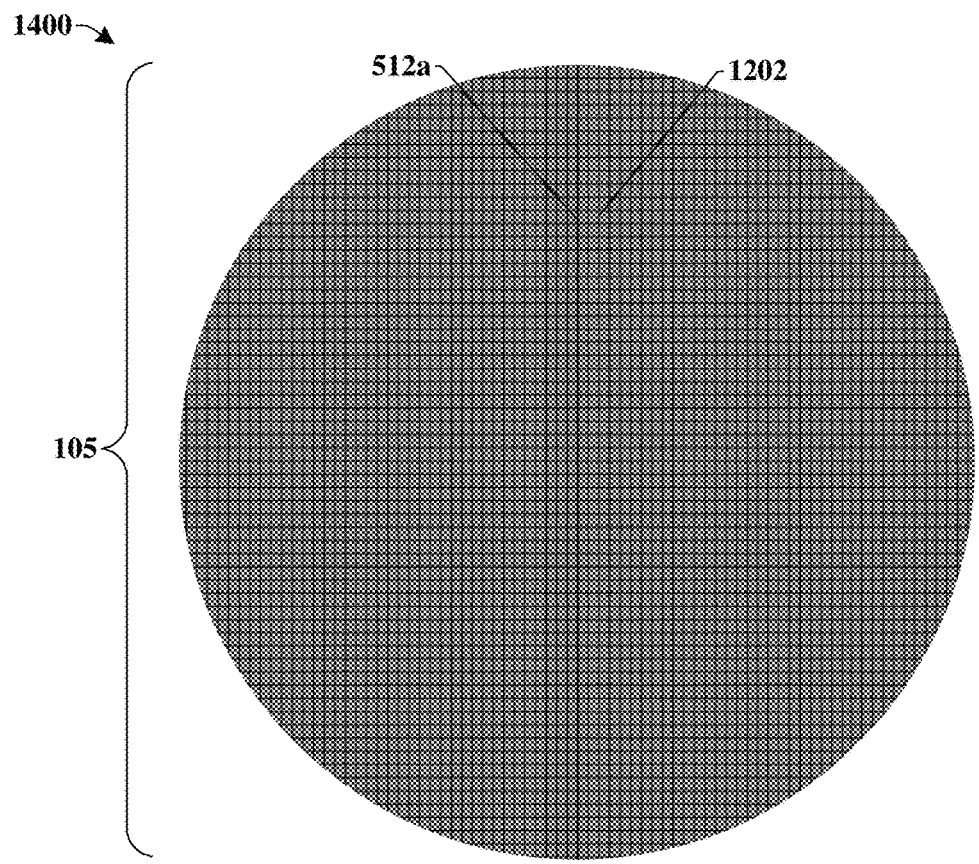

FIG. 14 illustrates a top-view 1400 of some embodiments of the photosensitive layer 105 after the immersion lithography process of FIGS. 8-12, for example, is repeated over the total area of the photosensitive layer 105. In some embodiments, the total area of the photosensitive layer 105 may be defined as the surface area of the top surface of the photosensitive layer 105. In some such embodiments, the solubility pattern of the photomask (508 of FIG. 12) may be transferred to multiple areas (e.g., the first area 512, the second area 1202) of the photosensitive layer 105 such that the total area of the photosensitive layer 105 comprises soluble regions and insoluble regions. In some other embodiments, the immersion lithography process may only be repeated over part of the total area of the photosensitive layer 105.

Figure 15:
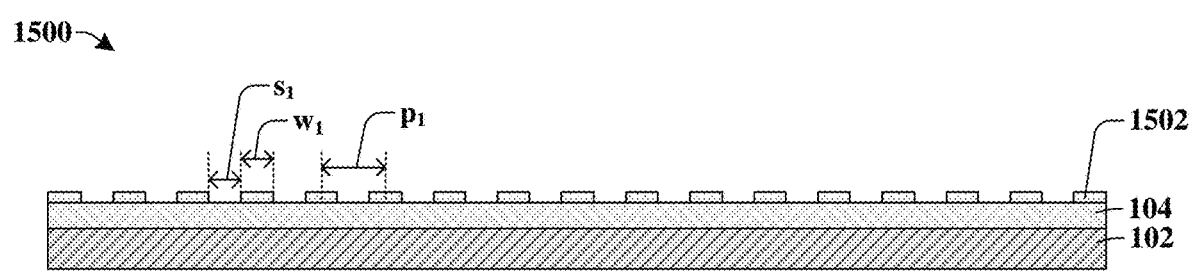

As shown in cross-sectional view 1500 of FIG. 15, in some embodiments, soluble regions of the photosensitive layer (105 of FIG. 14) are removed by a developer or wet etchant such that a patterned photosensitive layer 1502 is arranged over the semiconductor substrate 104. In some embodiments, features of the patterned photosensitive layer 1502 may a first width $w_1$ that is in a range of between, for example, approximately 1 nanometer and approximately 45 nanometers. Similarly, in some embodiments, the features of the patterned photosensitive layer 1502 may be spaced apart by a first space distance si. In some embodiments, the first space distance si may also be in a range of between, for example, approximately 1 nanometer and approximately 45 nanometers. Accordingly, in some embodiments, the features of the patterned photosensitive layer 1502 may have a first pitch pi in a range of between, for example, approximately 2 nanometers and approximately 90 nanometers. It will be appreciated that other values for the first width $w_1$, the first space distance si, and the first pitch pi are also within the scope of this disclosure. Further, it will be appreciated that in some embodiments, the method may continue with portions of the semiconductor substrate 104 and/or layers between the semiconductor substrate 104 and the patterned photosensitive layer 1502 being removed according to the patterned photosensitive layer 1502 and with deposition processes performed to form one or more semiconductor devices on or within the semiconductor substrate 104.

Because of the extractor piping utilized in the immersion lithography process, features and/or spacing between the features of the semiconductor devices may be relatively small (e.g., less than about 45 nanometers) and damage to such small semiconductor devices is mitigated.

Figure 16:
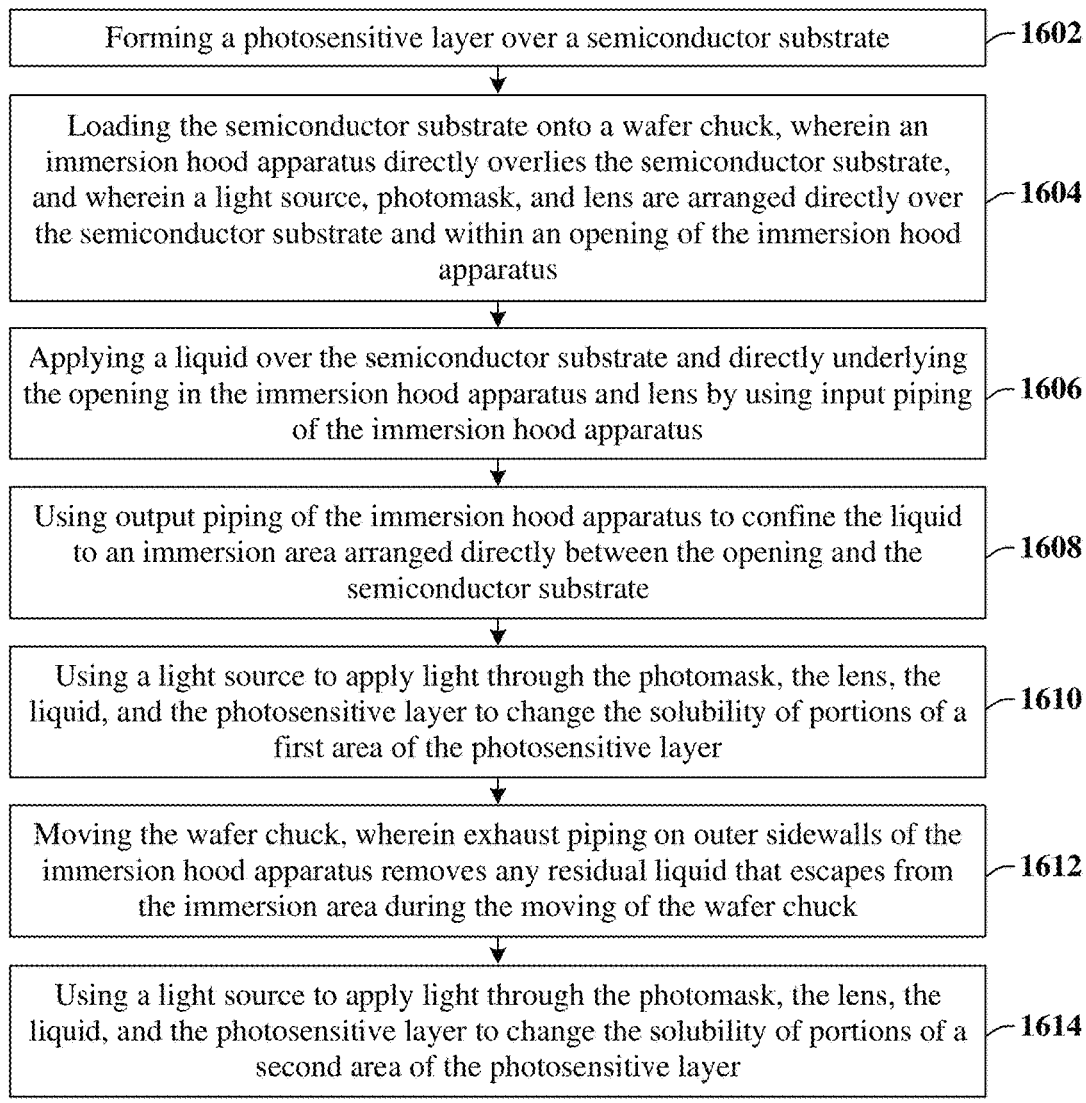
FIG. 16 illustrates a flow diagram of some embodiments of the method corresponding to FIGS. 6-15.

FIG. 16 illustrates a flow diagram of some embodiments of a method 1600 of performing an immersion lithography process using extractor piping to reduce damage by liquid left behind on a semiconductor substrate from the immersion lithography process.

While method 1600 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 1602, a photosensitive layer is formed over a semiconductor substrate. FIG. 6 illustrates cross-sectional view 600 of some embodiments that may correspond to act 1602.

At act 1604, the semiconductor substrate is loaded onto a wafer chuck, wherein an immersion hood apparatus directly overlies the semiconductor substrate, and wherein a light source, photomask, and lens are arranged directly over the semiconductor substrate and within an opening of the immersion hood apparatus. FIG. 7 illustrates cross-sectional view 700 of some embodiments that may correspond to act 1604.

At act 1606, a liquid is applied over the semiconductor substrate and directly under the opening in the immersion hood apparatus and lens by using input piping of the immersion hood apparatus.

At act 1608, output piping of the immersion hood apparatus is used to confine the liquid to an immersion area arranged directly between the opening and the semiconductor substrate. FIG. 8 illustrates cross-sectional view 800 of some embodiments that may correspond to acts 1606 and 1608.

At act 1610, a light source is used to apply light through the photomask, the lens, the liquid, and the photosensitive layer to change the solubility of portions of a first area of the photosensitive layer. FIG. 9 illustrates cross-sectional view 900 of some embodiments that may correspond to act 1610.

At act 1612, the wafer chuck is moved, wherein exhaust piping on outer sidewalls of the immersion hood apparatus removes any residual liquid that escapes from the immersion area during the moving of the wafer chuck. FIGS. 11A and 11B illustrate cross-sectional views 1100A and 1100B, respectively, of some embodiments that may correspond to act 1612.

At act 1614, the light source is used to apply light through the photomask, the lens, the liquid, and the photosensitive layer to change the solubility of portions of a second area of the photosensitive layer. FIG. 12 illustrates cross-sectional view 1200 of some embodiments that may correspond to act 1614.

Therefore, the present disclosure relates to a method of performing an immersion lithography process over a semiconductor substrate, wherein an immersion hood apparatus comprises extractor piping on outer sidewalls of the immersion hood apparatus to remove any residual liquid that escapes from the immersion hood apparatus and thus, to mitigate damage to devices formed on or within the semiconductor substrate.

Accordingly, in some embodiments, the present disclosure relates to a process tool, comprising: a lithography apparatus arranged over a wafer chuck and comprising: a photomask arranged over the wafer chuck, a light source arranged over the photomask, and a lens arranged between the photomask and the wafer chuck; and an immersion hood apparatus arranged over the wafer chuck and laterally around the lithography apparatus, wherein the immersion hood apparatus comprises: input piping arranged on a lower surface of the immersion hood apparatus and configured to distribute a liquid between the lens and the wafer chuck, output piping arranged on the lower surface of the immersion hood apparatus and configured to contain the liquid arranged between the lens and the wafer chuck, and extractor piping arranged on an outer sidewall of the immersion hood apparatus and configured to remove any liquid above the wafer chuck that is outside of the immersion hood apparatus.

In other embodiments, the present disclosure relates to a process tool comprising: a wafer chuck configured to hold a semiconductor substrate; a lens arranged over the wafer chuck; a light source arranged over the lens; and an immersion hood apparatus arranged over the wafer chuck, wherein the lens is laterally surrounded by the immersion hood apparatus, and wherein the immersion hood apparatus comprises: input piping arranged on a lower surface of the immersion hood apparatus and configured to distribute a liquid between the lower surface of the immersion hood apparatus and the wafer chuck and between the lens and the wafer chuck, output piping arranged on the lower surface of the immersion hood and configured to contain the liquid arranged between the immersion hood apparatus and the wafer chuck, wherein the output piping laterally surrounds the input piping, and extractor piping arranged on a sidewall of the immersion hood apparatus and configured to remove residual liquid outside of an area of the semiconductor substrate that underlies the immersion hood apparatus and the lens, wherein the extractor piping is farther from the lens than the output piping.

In yet other embodiments, the present disclosure relates to a method comprising: forming a photosensitive layer over a semiconductor substrate; loading the semiconductor substrate onto a wafer chuck, wherein an immersion hood apparatus overlies the semiconductor substrate, and wherein a light source, photomask, and lens are arranged over the semiconductor substrate and an opening in the immersion hood apparatus; using input piping of the immersion hood apparatus to apply a liquid over the semiconductor substrate and directly underlying the opening in the immersion hood apparatus and the lens; using output piping of the immersion hood such that the liquid is confined to an immersion area directly between the opening and the semiconductor substrate; using the light source to apply light through the photomask, the lens, the liquid, and the photosensitive layer to change the solubility of portions of a first area of the photosensitive layer according to the photomask; moving the wafer chuck; and using the light source to apply light through the photomask, the lens, the liquid, and the photosensitive layer to change the solubility of portions of a second area of the photosensitive layer according to the photomask, wherein exhaust piping arranged on outer sidewalls of the immersion hood apparatus removes any residual liquid that escaped from the immersion area when the wafer chuck moved.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A process tool, comprising:
a lithography apparatus over a wafer chuck; and
an immersion hood apparatus over the wafer chuck and laterally around the lithography apparatus, wherein the immersion hood apparatus comprises:
output piping on a lower surface of the immersion hood apparatus and configured to contain a liquid to a containment area between the lithography apparatus and the wafer chuck; and
extractor piping configured to attract and remove any liquid outside the containment area via an extractor opening of the extractor piping, which is at a corner defined by the lower surface of the immersion hood apparatus and an outermost sidewall of the immersion hood apparatus that faces away from the lithography apparatus, wherein the extractor piping is covered by an upper portion of the immersion hood apparatus and is farther from a width-wise center of the immersion hood apparatus than the output piping at the lower surface.

2. The process tool according to claim 1, wherein the extractor opening faces an area uncovered by the immersion hood apparatus and uncovered by the lithography apparatus.

3. The process tool according to claim 1, wherein the extractor opening extends in a closed path around the immersion hood apparatus.

4. The process tool according to claim 1, wherein the extractor piping forms an acute angle with respect to the lower surface of the immersion hood apparatus.

5. The process tool according to claim 1, wherein the lithography apparatus comprises:
a light source; and
a lens arranged between the light source and the wafer chuck.

6. The process tool according to claim 1, wherein the immersion hood apparatus further comprises:
input piping on the lower surface of the immersion hood apparatus and configured to distribute the liquid between the lithography apparatus and the wafer chuck.

7. A process tool, comprising:
a wafer chuck;
a lens over the wafer chuck;
a light source over the lens; and
an immersion hood apparatus over the wafer chuck, wherein the lens is laterally surrounded by the immersion hood apparatus, and wherein the immersion hood apparatus comprises extractor piping on a first sidewall of the immersion hood apparatus, which is separated from a second sidewall of the immersion hood apparatus by a width of the immersion hood apparatus and which faces an opposite direction as the second sidewall, wherein the extractor piping has multiple discrete openings on the first sidewall of the immersion hood apparatus, and wherein the multiple discrete openings border on a common side of the immersion hood apparatus and are spaced from each other.

8. The process tool according to claim 7, wherein the extractor piping is configured to remove liquid outside of an area spanning the width.

9. The process tool according to claim 7, wherein the extractor piping is at a bottom corner of the immersion hood apparatus, which is defined by the first sidewall and a bottom surface of the immersion hood apparatus.

10. The process tool according to claim 7, wherein the extractor piping comprises:
a lower segment demarcated by a first pair of opposing sidewalls of the immersion hood apparatus, which are elongated in a first direction forming an acute angle with respect to a bottom surface of the immersion hood apparatus; and
an upper segment coupled to the lower segment, wherein the upper segment is demarcated by a second pair of opposing sidewalls of the immersion hood apparatus, which are elongated in a second direction forming a right angle with respect to the bottom surface of the immersion hood apparatus.

11. The process tool according to claim 7, wherein the immersion hood apparatus further comprises:
input piping configured to distribute liquid between the immersion hood apparatus and the wafer chuck and between the lens and the wafer chuck; and
output piping configured to contain the liquid to the immersion hood apparatus.

12. A process tool, comprising:
a lithography apparatus over a wafer chuck; and
an immersion hood apparatus over the wafer chuck and laterally around the lithography apparatus, wherein the immersion hood apparatus comprises:
input piping on a lower surface of the immersion hood apparatus;
output piping on the lower surface of the immersion hood apparatus; and
extractor piping configured to attract and remove any liquid that is outside of the immersion hood apparatus, wherein the extractor piping has a pair of extractor piping segments respectively on opposite sides of the immersion hood apparatus and between which the input piping and the output piping are arranged, and wherein the extractor piping segments extend into the immersion hood apparatus laterally towards each other from the lower surface of the immersion hood apparatus and have individual diameters that increase along their lengths away from the lower surface.

13. The process tool according to claim 12, wherein the extractor piping segments have individual sidewalls facing each other and extending in parallel.

14. The process tool according to claim 12, wherein the output piping is configured to receive liquid from the input piping.

15. The process tool according to claim 1, wherein the extractor piping has a first pair of opposing sidewalls and a second pair of opposing sidewalls that are defined by the immersion hood apparatus on a common side of the immersion hood apparatus, wherein the first pair of opposing sidewalls extend in parallel from the lower surface of the immersion hood apparatus and have a first separation from each other, wherein the second pair of opposing sidewalls overlie and extend in parallel respectively from the first pair of opposing sidewalls, and wherein the second pair of opposing sidewalls have a second separation from each other that is greater than the first separation.

16. The process tool according to claim 1, wherein the extractor piping surrounds the lithography apparatus, and wherein the extractor piping comprises multiple discrete openings on the outermost sidewall of the immersion hood apparatus.

17. The process tool according to claim 7, wherein the extractor piping surrounds the lens and is configured to attract and remove residual liquid outside of the immersion hood apparatus.

18. The process tool according to claim 7, wherein the multiple discrete openings face an area uncovered by the immersion hood apparatus and uncovered by a lithography apparatus that comprises the lens and the light source.

19. The process tool according to claim 12, wherein the extractor piping has a first pair of opposing, parallel sidewalls on a common side of the immersion hood apparatus and separated from each other by a first separation, wherein the extractor piping further has a second pair of opposing, parallel sidewalls on the common side and extending from the lower surface of the immersion hood apparatus respectively to the first pair of opposing, parallel sidewalls, and wherein the second pair of opposing, parallel sidewalls are separated from each other by a second separation less than the first separation.

20. The process tool according to claim 12, wherein the extractor piping is at a bottom corner of the immersion hood apparatus, which is formed by the lower surface of the immersion hood apparatus and an outermost sidewall of the immersion hood apparatus that faces away from the lithography apparatus.

* * * * *